(12) United States Patent
Cousinard et al.

(10) Patent No.: US 8,428,535 B1
(45) Date of Patent: Apr. 23, 2013

(54) RECEIVER DYNAMIC POWER MANAGEMENT

(75) Inventors: David Cousinard, Morges (CH);
Patrick Clement, Belmont (CH);
Cao-Thong Tu, Lausanne (CH)

(73) Assignee: Marvell International Ltd., Hamilton (BM)

( * ) Notice: Subject to any disclaimer, the term of this patent is extended or adjusted under 35 U.S.C. 154(b) by 1254 days.

(21) Appl. No.: 12/175,034

(22) Filed: Jul. 17, 2008

Related U.S. Application Data

(60) Provisional application No. 60/952,756, filed on Jul. 30, 2007.

(51) Int. Cl.
*H04B 1/06* (2006.01)
*H04B 7/00* (2006.01)

(52) U.S. Cl.
USPC ............... 455/234.2; 455/241.1; 455/245.2; 455/251.1; 455/343.2; 455/226.2

(58) Field of Classification Search ........ 455/232.1–254, 455/67.11, 134, 226.2, 306, 307, 339–343.5, 455/574
See application file for complete search history.

(56) References Cited

U.S. PATENT DOCUMENTS

| | | | | |
|---|---|---|---|---|
| 5,722,062 A * | 2/1998 | Nakanishi et al. | ......... | 455/247.1 |
| 6,026,288 A * | 2/2000 | Bronner | ......... | 455/343.2 |
| 6,442,380 B1 * | 8/2002 | Mohindra | ......... | 455/234.1 |
| 6,670,901 B2 * | 12/2003 | Brueske et al. | ......... | 341/139 |
| 6,873,832 B2 | 3/2005 | Shi | | |
| 7,010,330 B1 * | 3/2006 | Tsividis | ......... | 455/574 |
| 7,065,134 B2 * | 6/2006 | Papanikolaou et al. | ....... | 375/229 |
| 7,072,632 B2 * | 7/2006 | Astrachan et al. | ......... | 455/226.2 |
| 7,095,994 B1 * | 8/2006 | Aytur et al. | ......... | 455/234.1 |
| 7,184,729 B2 * | 2/2007 | Kluge et al. | ......... | 455/234.1 |
| 7,299,021 B2 * | 11/2007 | P rssinen et al. | ......... | 455/226.1 |
| 7,400,870 B2 * | 7/2008 | Scheffler | ......... | 455/245.1 |
| 7,668,517 B2 * | 2/2010 | Li | ......... | 455/136 |
| 7,894,786 B2 * | 2/2011 | Hwang | ......... | 455/245.1 |
| 8,107,911 B2 * | 1/2012 | Dvorszky et al. | ......... | 455/232.1 |
| 8,135,367 B2 * | 3/2012 | Rofougaran et al. | ......... | 455/234.1 |
| 2003/0083030 A1 * | 5/2003 | Scheffler | ......... | 455/245.1 |
| 2003/0100279 A1 * | 5/2003 | Medvid et al. | ......... | 455/164.2 |
| 2003/0203726 A1 * | 10/2003 | Kluge et al. | ......... | 455/234.1 |

(Continued)

OTHER PUBLICATIONS

Peter M. Stroet et al., A Zero-IF Single-Chip Transceiver for up to 22Mb/s QPSK 802.11b Wireless LAN, Feb. 6, 2001, 2001 IEEE International Solid-State Circuits Conference, ISSCC 2001/SESSION 13/Wireless LAN/13.5, 3 pages.*

*Primary Examiner* — Edward Urban
*Assistant Examiner* — Rui Hu

(57) ABSTRACT

A controller in a receiver monitors RSSI and AGC gain levels to determine signal conditions and adjust filter performance accordingly to optimize power consumption while providing acceptable signal quality. When RSSI level is high and AGC gain is low, a strong signal-of-interest is present. In this case, adaptive filter bias currents may be reduced raise the noise floor and degrade intermodulation to reduce power consumption because the strong signal-of-interest can tolerate the higher noise and distortion. When the RSSI level is low and AGC gain is high, a weak signal is present a low noise mode may be effected by increasing bias current to filters used to lower the noise floor, but intermodulation effects may still be tolerated so those filters may be cut back. Other cases are supported. RSSI and AGC gain level thresholds may be dynamically altered based on relative RSSI and AGC levels.

14 Claims, 10 Drawing Sheets

U.S. PATENT DOCUMENTS

| | | | |
|---|---|---|---|
| 2005/0026564 A1* | 2/2005 | Haub et al. ................. | 455/67.11 |
| 2005/0189951 A1* | 9/2005 | Ibrahim et al. ............... | 324/616 |
| 2005/0215219 A1* | 9/2005 | Khorram .................... | 455/226.1 |
| 2006/0014508 A1* | 1/2006 | Seneschal et al. .......... | 455/253.2 |
| 2007/0004358 A1* | 1/2007 | Moorti ....................... | 455/226.2 |
| 2007/0129034 A1* | 6/2007 | Adams et al. ................ | 455/138 |
| 2007/0293177 A1* | 12/2007 | Li ............................... | 455/232.1 |
| 2008/0051050 A1* | 2/2008 | Kim et al. ................... | 455/234.1 |
| 2009/0042527 A1* | 2/2009 | Niknejad .................... | 455/234.2 |
| 2010/0022211 A1* | 1/2010 | Huang ........................ | 455/232.1 |
| 2010/0156575 A1* | 6/2010 | Shah et al. .................. | 334/78 |
| 2011/0092175 A1* | 4/2011 | Tanaka et al. ............... | 455/234.1 |

* cited by examiner

RECEIVER DYNAMIC POWER MANAGEMENT

CROSS-REFERENCE TO RELATED APPLICATION

This application claims the benefit of U.S. Provisional Application No. 60/952,756, entitled "DYNAMIC POWER MANAGEMENT FOR A FM RECEIVER," filed on Jul. 30, 2007, which is hereby incorporated by reference herein.

DESCRIPTION OF RELATED ART

Automatic gain control (AGC) is used in receivers and other circuits to automatically adjust signal levels. AGC circuits measure the output of a gain stage and increase or decrease a gain level to adjust the output to meet a criteria. For example, the gain level is adjusted to keep a peak level of an input signal just below a saturation level of a linear range of an amplifier lineup or signal conversion process. Typically, gain stage output measurements include all in-band signals, including not only a signal-of-interest but also noise and interferers.

Another measurement made in many receivers is a receive signal strength indicator (RSSI). A well-known RSSI measurement is reflected by the number of 'bars' on a cellular telephone. The RSSI level is an indication of signal strength of a signal-of-interest, including an intermodulation product, if any, called IP3 for third-order intermodulation product. Mathematically, IP3 appears near the signal-of-interest and causes distortion.

Increased filtering at radio frequency and intermediate frequency stages as well as aggressive digital signal processing at the outputs of various processing stages can all be effective at reducing noise and IP3 distortion. However, aggressive filtering or digital signal processing often consumes more energy, which, in a battery operated environment, can cause an undesirable reduction in battery life. Direct measurement of noise and IP3 can be used to adjust filter levels and corresponding power consumption. However, measuring noise and distortion directly may add circuitry that could defeat any potential power savings from less aggressive filtering when such filtering is not required.

SUMMARY OF THE DISCLOSURE

A receiver that dynamically adjusts the receiver stages to varying signal conditions monitors AGC gain levels and an RSSI level and uses those measurements to derive signal information regarding a received signal. Using the signal information, adjustments to various stages in a receiver lineup can be adjusted to maintain acceptable signal quality levels while conserving energy.

In one embodiment, a level of amplification of an early-stage AGC is monitored to determine if the received signal is weak or strong. The RSSI is used to determine if the signal-of-interest at the antenna is weak or strong. Using AGC level and RSSI as two state inputs, a decision block can be used to set a number of operating modes. First, when the signal at the antenna is strong and the signal-of-interest at the antenna is weak, a high performance mode may be used to both lower the noise floor and diminish IP3, at the cost of increased power consumption. Second, when the signal at the antenna is strong and the signal-of-interest at the antenna is also strong, a power-save mode can be implemented to reduce signal processing and increase battery life. Third, when the signal at the antenna is weak and the signal-of-interest at the antenna is also weak, a low-noise mode may be used to lower the noise floor but allow a certain degree of IP3, to reduce some of the signal processing overhead and save energy over the high performance mode.

DETAILED DESCRIPTION

Figure 1:
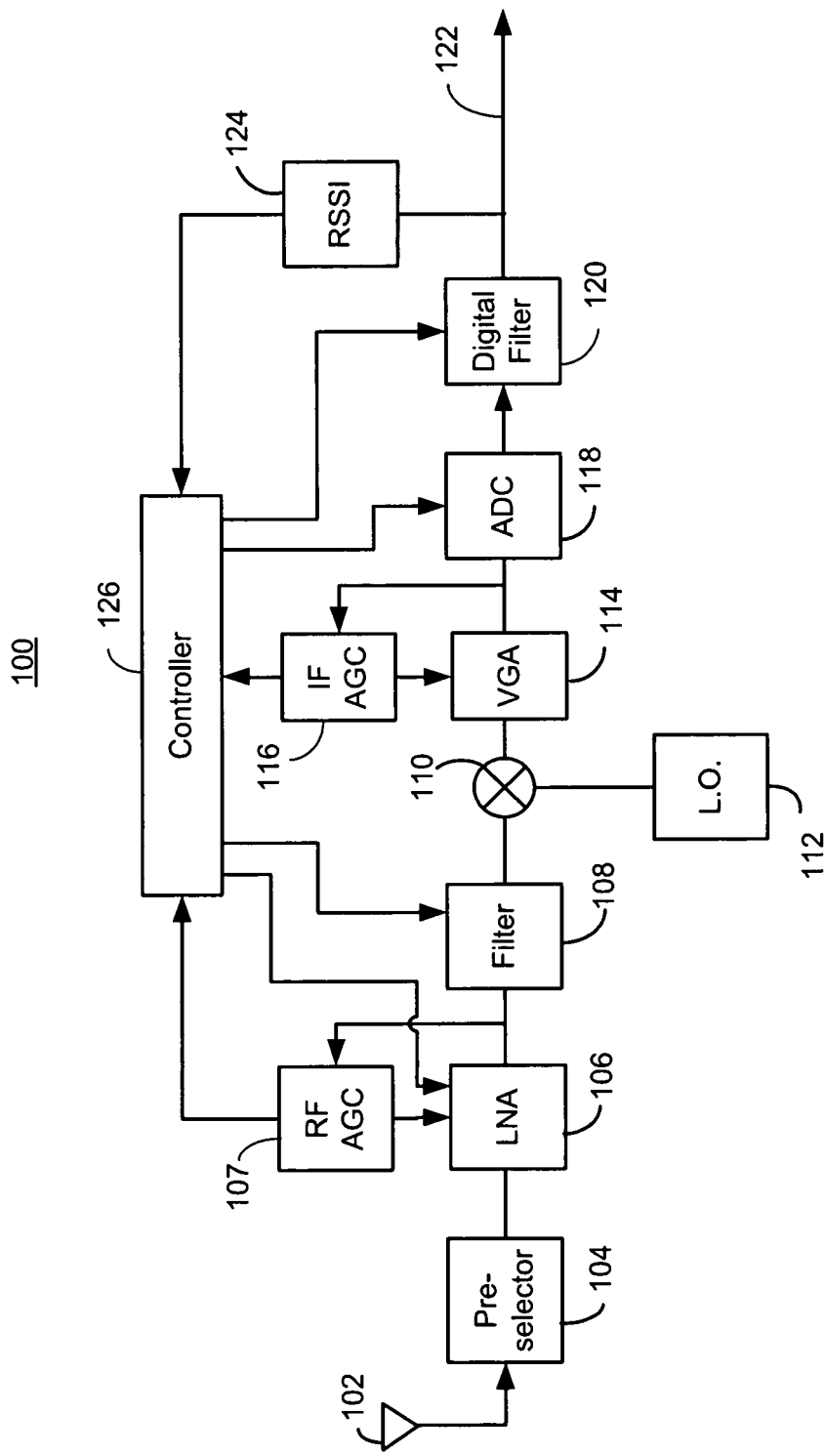
FIG. 1 is a block diagram of a receiver arranged for dynamic power management.

FIG. 1 is a block diagram of a receiver 100 arranged for dynamic power management. The receiver 100 may include an antenna 102, a preselector 104, a low noise amplifier (LNA) 106 with variable gain under the control of a radio frequency (RF) automatic gain control 107 (AGC). An adaptive filter 108 may be coupled to the LNA 106. The exemplary receiver 100 may also include a mixer 110, a local oscillator 112, a variable gain amplifier 114 controlled by a intermediate frequency automatic gain converter (IF AGC) 116, an analog-to-digital converter 118, a digital filter 120, and an output 122. The output 122 may be coupled to a received signal strength indicator (RSSI) generator 124. In some embodiments an antenna may not be required, for example, in a cable television set-top box. The preselector 104 may be a bandpass filter, often passive, used to remove received signals outside of a band range of interest. The AGC 107, may adjust internal gain stages of the LNA 106, to selectively increase weak signals from the preselector 104 so that the signal leaving the LNA 106 approaches a limit signal level, such as, a saturation level of subsequent receiver circuitry. The signal at the LNA 106 may include not only the signal-of-interest, but also nearby interferers (other in-band signals) and noise, including various artifacts from other signals. The adaptive filter 108 may be an active filter that can be tuned to a frequency centered on a signal-of-interest as well as adjusting bandwidth and roll off characteristics.

The mixer 110 operates to combine an output of the local oscillator 112 with the received signal coming from the filter 108.

The variable gain amplifier 114 and the IF AGC 116 operate to further adjust the signal level at the output of the VGA 114 to approach a limit level. When nearby signals are present, an undesirable byproduct of the mixing and amplification processes may be intermodulation products. In most cases, intermodulation products fall outside the band of interest, but in some cases, and particularly for third order intermodulation products, interference may appear at frequencies close to that of the signal-of-interest.

The analog-to-digital converter 118 may take the analog output of the VGA 114 and convert it to a digital signal which may then be passed on to the digital filter 120. The digital filter 120 may operate to identify and filter noise and intermodulation products, particularly third order intermodulation products (IP3) to produce the output signal at the output 122. The RSSI generator 124 may be used to measure the magnitude of a final signal presented at the output 122. The final signal, under most circumstances, is composed primarily of a signal-of-interest, along with those elements of noise and IP 3 not removed by previous stages in the lineup.

A controller 126 may accept data from the RF AGC 107, the IF AGC 116 and the RSSI generator 124 to infer signal information regarding the received signal at the antenna 102 in order to adjust filtering characteristics of the LNA 106, filters 108, 120, and ADC 118, and correspondingly, their power consumption. The controller 126 may include a processor or controller (not depicted) with internal memory, external memory, or both (not depicted). The controller 126 may execute software instructions stored in the memory for implementing evaluation of the AGC and RSSI inputs and to control filtering characteristics and power consumption. Optionally, these functions may be implemented in hardware or firmware. Based on the disclosure and teachings provided herein, transformation of such measurement and control function between software and firmware/hardware is known by those of ordinary skill in the art. By determining the characteristics of the signal, tradeoffs between power consumption and filtering effectiveness can be made to optimize desired performance of the receiver lineup versus battery life or some other measure of power consumption, desired energy, etc.

In operation, a signal arriving at the antenna 102 may be initially filtered at the preselector 104 and be amplified by the LNA 106 according to signal level. When the signal at the antenna 102 is sufficiently strong, including a signal-of-interest, noise, and interferers, the LNA 106 may provide a minimal, if any, amplification. When the signal at the antenna 102 is weak, the LNA 106 may increase its amplification level to increase the signal to approach a saturation level. The AGC 107 may report a gain level of the LNA 106 to the controller 126. The controller 126 may compare the gain level to a first threshold level. If the gain level is below the threshold, a gain level may be regarded to be low and, if above the first threshold, the gain level may be regarded to be high.

As the signal propagates through the receiver lineup, the signal may be mixed to convert it to an intermediate frequency and filtered to remove some, if not most, of the noise, interferers, and intermodulation products introduced by the filter 108, the variable gain amplifier 114, the ADC 118 and digital filter 120. An RSSI level may be measured by the RSSI generator 124 and be reported to the controller 126. The controller 126 may compare the RSSI level to a second threshold and assign an RSSI value as being high or low depending upon whether the RSSI level is above or below the second threshold. When the variable gain amplifier's gain level is reported to the controller 126 by the IF AGC 116, its level may be compared to a third threshold to determine if its level should be regarded as high or low. When the RF AGC gain level and the IF AGC gain level are both used, they may be combined before comparing to a unified threshold level or they may be evaluated separately and the resulting values reconciled. Further discussion of power management in the receiver 100 continues in the description of FIG. 2.

Figure 2:
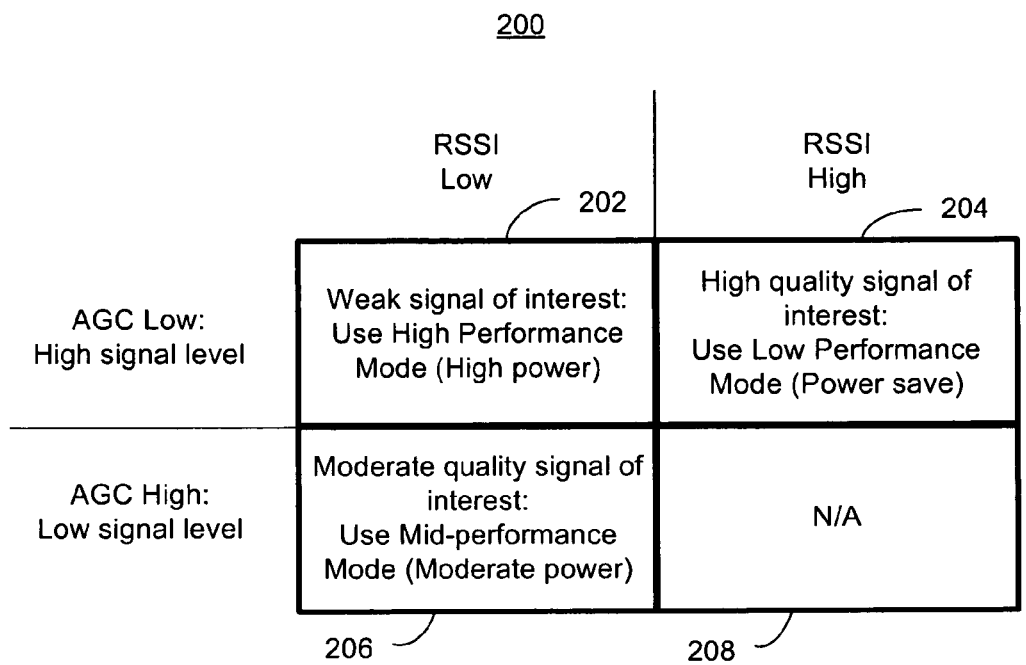
FIG. 2 is a chart showing power management selections for the receiver of FIG. 1.

Referring to FIG. 2, a chart 200 depicts how the data from the AGCs 107 and 116 and RSSI 118 may be used by the controller 126. The chart 200 shows RSSI level across the top and AGC level down the side. When the AGC level is low, the signal level at the antenna is high and if the RSSI level is low, box 202 defines the state of the receiver 100. When the overall signal level at the antenna is high and the level of the signal-of-interest at the antenna is low, there is the implication that a weak signal-of-interest is present among a relatively strong set of interferers. Therefore, a high performance mode may be used to provide the most signal processing available to lower the noise floor and increase the signal-to-noise ratio (SNR) and the signal-to-noise+distortion (SINAD). Another measure of distortion is IP3, the third-order intermodulation intercept point. To accomplish this increased filtering, for example, a bias current to both the low noise amplifier 106 and the variable gain amplifier 114 may be increased and a processing rate for the ADC 118 and digital filter 116 may be increased. Correspondingly, power consumption of the filters 106, 114, ADC 118, and digital filter 116 may be increased over a nominal level.

When the AGC level or levels are low, the signal level at the antenna 102 is high and if the RSSI level is high, box 204 defines the state of the receiver 100. When the overall signal level at the antenna is high, and the level of the signal-of-interest is also high, the level of interferers cannot necessarily be deduced, because if present, they are masked by the strong signal-of-interest. In this case, a low performance, power-saving mode may be used. The noise floor may be allowed to rise, and the lack of interferers allows circuitry used to control distortion/SINAD to be turned down (e.g. use less power). The result is an acceptable signal without expending power on filters that may not significantly improve signal quality. This mode may be labeled a low-performance or power-saving mode.

When the AGC level is high (e.g. a low signal level) and the RSSI is also low, the implication is that the signal at the antenna is primarily the signal-of-interest and is relatively free of interferers, e.g. the low signal that is present is primarily the signal-of-interest. In this case, box 206 defines the state of the receiver 100. Because the signal is low, it may be important to keep the noise floor low, but the lack of interferers implies that the circuitry controlling distortion/SINAD can be relaxed, resulting in a moderate power savings over the high performance mode.

Box 208 defines a condition that is not likely to occur by definition, that is, a low overall signal but a high signal-of-interest. Therefore, it is not discussed.

In this illustration, simple predeteiniined trigger points (including hysteresis) may be set for AGC and RSSI levels, when determining filter settings. However, there is no reason to limit the circuitry in this manner. Discrete, or even continuous, values for threshold levels may be used based on absolute values of those signal levels, so that a "low" RSSI value may change in light of the AGC level, etc. Various methods for combining multiple AGC inputs may also be used, especially when values are near their respective thresholds. Some exemplary methods for AGC level combining are discussed below. Additional factors may be included in threshold determination, such as a battery level indication, allowing more aggressive power savings when battery power is below a certain level.

Figure 3A:
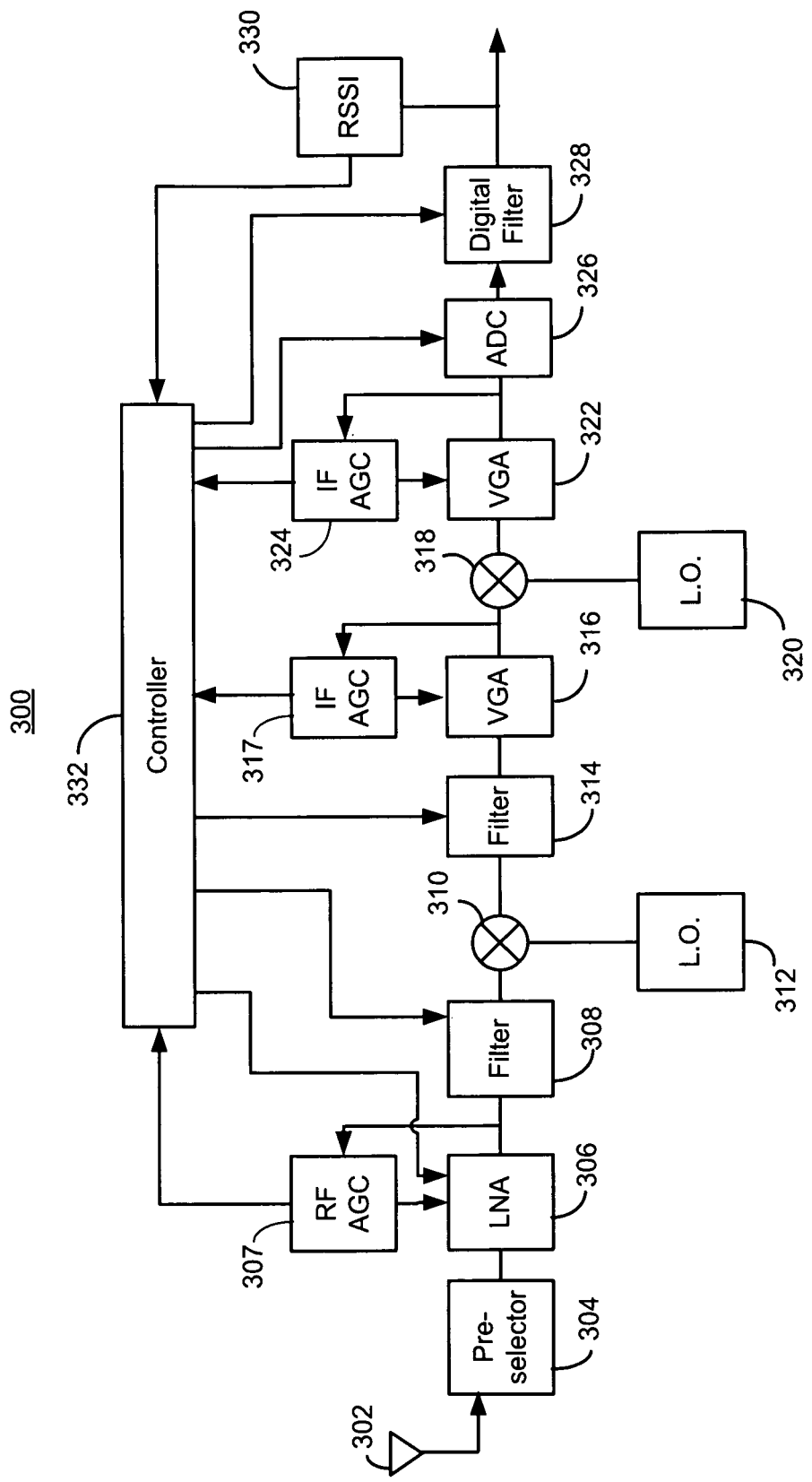
FIG. 3A is a block diagram of another embodiment of a receiver arranged for dynamic power management.

FIG. 3A illustrates another embodiment of a receiver 300 adapted for use in a low power mode. The receiver 300 has a two-stage intermediate frequency lineup and offers both more measurement points for signal determination and more control points for filter effectiveness/power control.

An RF lineup of the receiver 300 may include an antenna 302, a preselector 304, a first LNA 306 with associated RF AGC 307, a first filter 308, and an RF mixer 310. In some embodiments an antenna may not be required, for example, in a cable television set-top box a signal is provided to an input without an antenna. A first local oscillator 312 may provide a base signal to the RF mixer 310. In one embodiment, the LO 312 is 45 megahertz from the signal-of-interest, and the output of the mixer 310 is a 45 megahertz intermediate frequency (IF). The first IF lineup may include a second filter 314, and a variable gain amplifier (VGA) 316 controlled by an IF AGC 317. The output of the VGA 316 may be fed to a second mixer 318. In one embodiment, a second local oscillator 320 may be 10.7 megahertz different from (usually above) the frequency of the intermediate signal, so the output of a second mixer 318 is a second IF signal at 10.7 megahertz. A second VGA 322 under the control of the AGC 324 may further amplify and condition the signal. An analog-to-digital converter 326 may convert the second IF signal to a digital signal, which may then be filtered at digital filter 328. The digital filter 328 may be a digital signal processor. Other digital filter techniques, such as finite impulse response filters, may also be used. A received signal strength indicator (RSSI) generator 330 may measure the output level of the digital filter 328. A controller 332 may accept data from the first, second, and third AGCs 307, 317, 324, and the RSSI generator 326. Using that data, the controller 328 may determine an operating mode for the receiver 300.

As discussed with respect to FIG. 2, depending on the data it receives, the controller 332 may adjust bias current to the low noise amplifier 306, filters 308 and 314, as well as the clock rate, or other adjustment, of the ADC 326 and the digital filter 328.

Figure 3B:
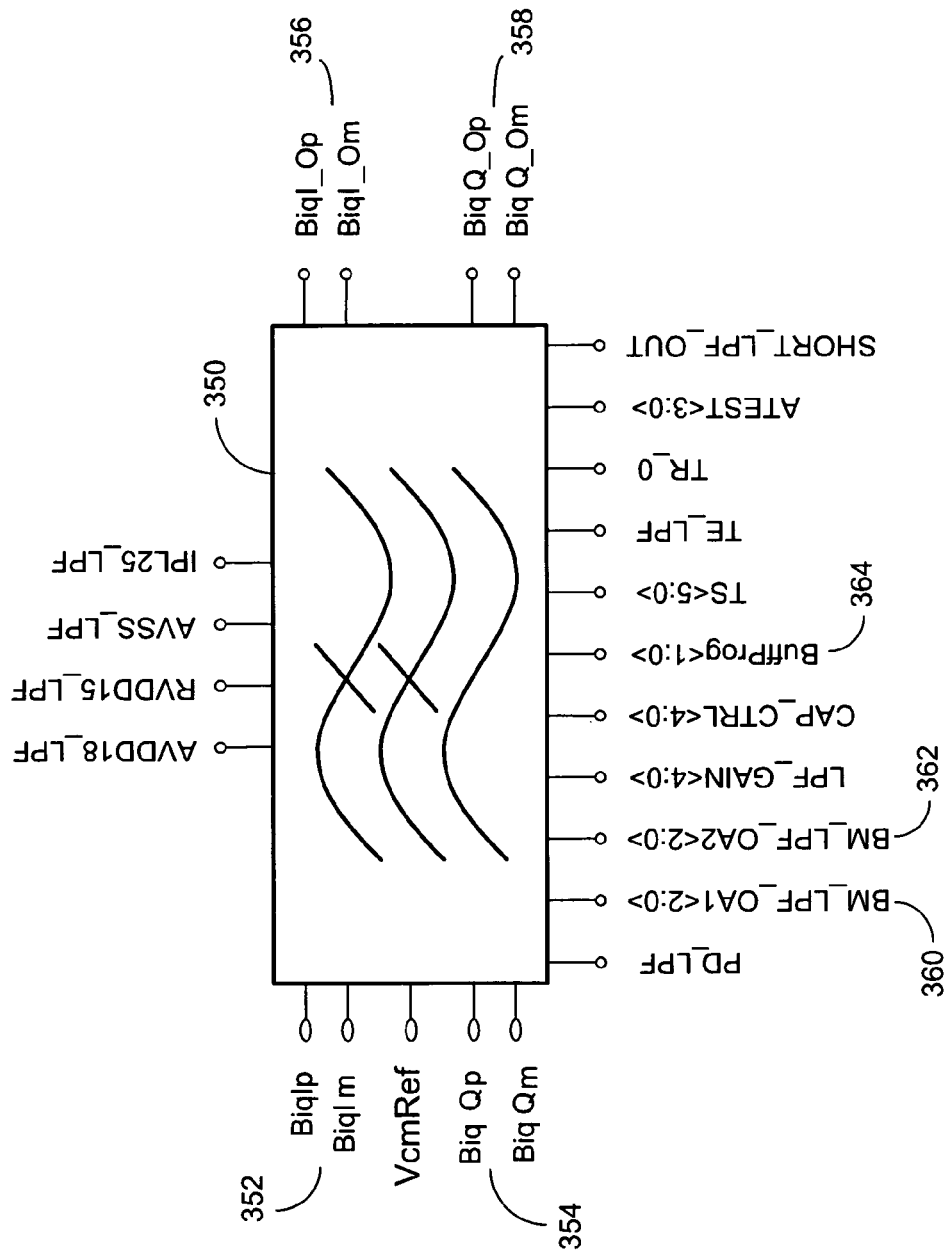
FIG. 3B is a block diagram of a representative filter with adjustable bias settings.

FIG. 3B is a block diagram of a representative filter 350 with controllable settings that affect bias current with corresponding changes in filter performance, such as would be suitable for use in the receiver of FIG. 2.

The filter 350 has I and Q inputs, 352 and 352, respectively and corresponding I and Q outputs 356 and 358, respectively. Filter performance may be adjusted by control inputs BM_LPF_OA1 360, BM_LPF_OA2 362, and BuffProg 364. In an exemplary embodiment of such a filter, tables 1-3 illustrate bias current settings controlled by the control inputs 360, 362, and 364.

Figure 3C:
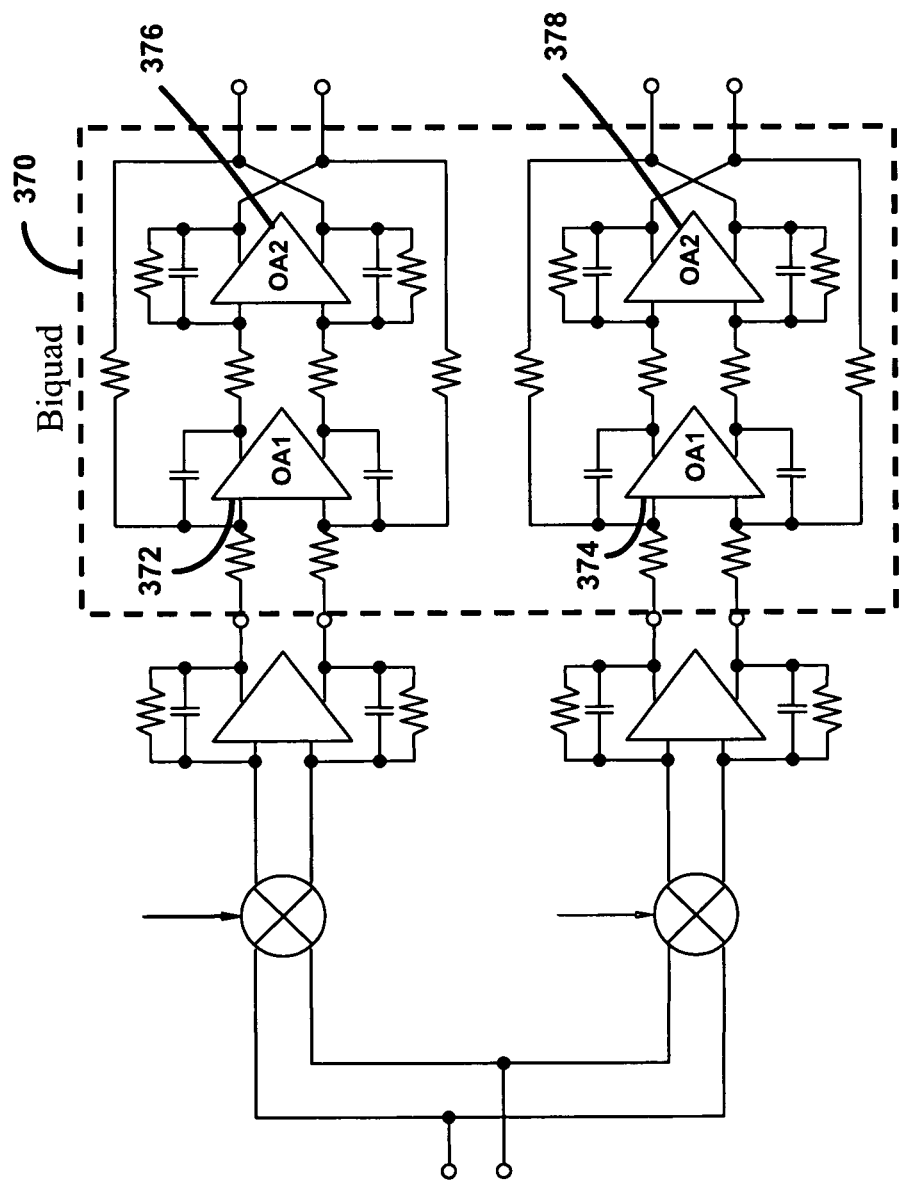
FIG. 3C is a circuit diagram of a portion of the filter of FIG. 3B.

Turning briefly to FIG. 3C, an exemplary circuit diagram for an analog portion of the filter 350 shows biquad section 370 with first operational amplifiers IOA1 372 and QOA1 374 and second operational amplifiers IOA2 376 and QOA2 378, to which tables 1-3 refer.

TABLE 1

Bias Mode control bit settings for
IOA1 372 and QOA1 374

| bits<0:2> | Current |
|---|---|
| <000> | 0.0 μA |
| <001> | 2.5 μA |
| <010> | 5.0 μA |
| <011> | 7.5 μA |
| <100> | 10.0 μA |
| <101> | 12.5 μA |
| <110> | 15.0 μA |
| <111> | 17.5 μA |

TABLE 2

Bias Mode control bit settings for
IOA2 376 and QOA2 378

| bits<0:2> | Current |
|---|---|
| <000> | 0.0 μA |
| <001> | 2.5 μA |
| <010> | 5.0 μA |
| <011> | 7.5 μA |

TABLE 2-continued

Bias Mode control bit settings for
IOA2 376 and QOA2 378

| bits<0:2> | Current |
|---|---|
| <100> | 10.0 μA |
| <101> | 12.5 μA |
| <110> | 15.0 μA |
| <111> | 17.5 μA |

TABLE 3

Output Stage Bias control bit settings for
op-amps IOA1 372, QOA1 376,
IOA2 374, and QOA2 378

| bits<0:1> | Current |
|---|---|
| <000> | OA1 Op-Amps: 40 μA |
|  | OA2 Op-Amps: 40 μA |
| <001> | OA1 Op-Amps: 80 μA |
|  | OA2 Op-Amps: 40 μA |
| <010> | OA1 Op-Amps: 40 μA |
|  | OA2 Op-Amps: 80 μA |
| <011> | OA1 Op-Amps: 80 μA |
|  | OA2 Op-Amps: 80 μA |

By changing the control bits as shown in tables 1-3, the performance of the op-amps can be adjusted with respect to noise floor and linearity. As expected, higher bias currents lower noise floors and increase linearity at the cost of increased power drain. For example, increasing bias mode current (see Tables 1-2) may lower noise floor. Increasing output stage current (see Table 3) may increase linearity with a corresponding improvement in IP3/distortion.

Figure 4:
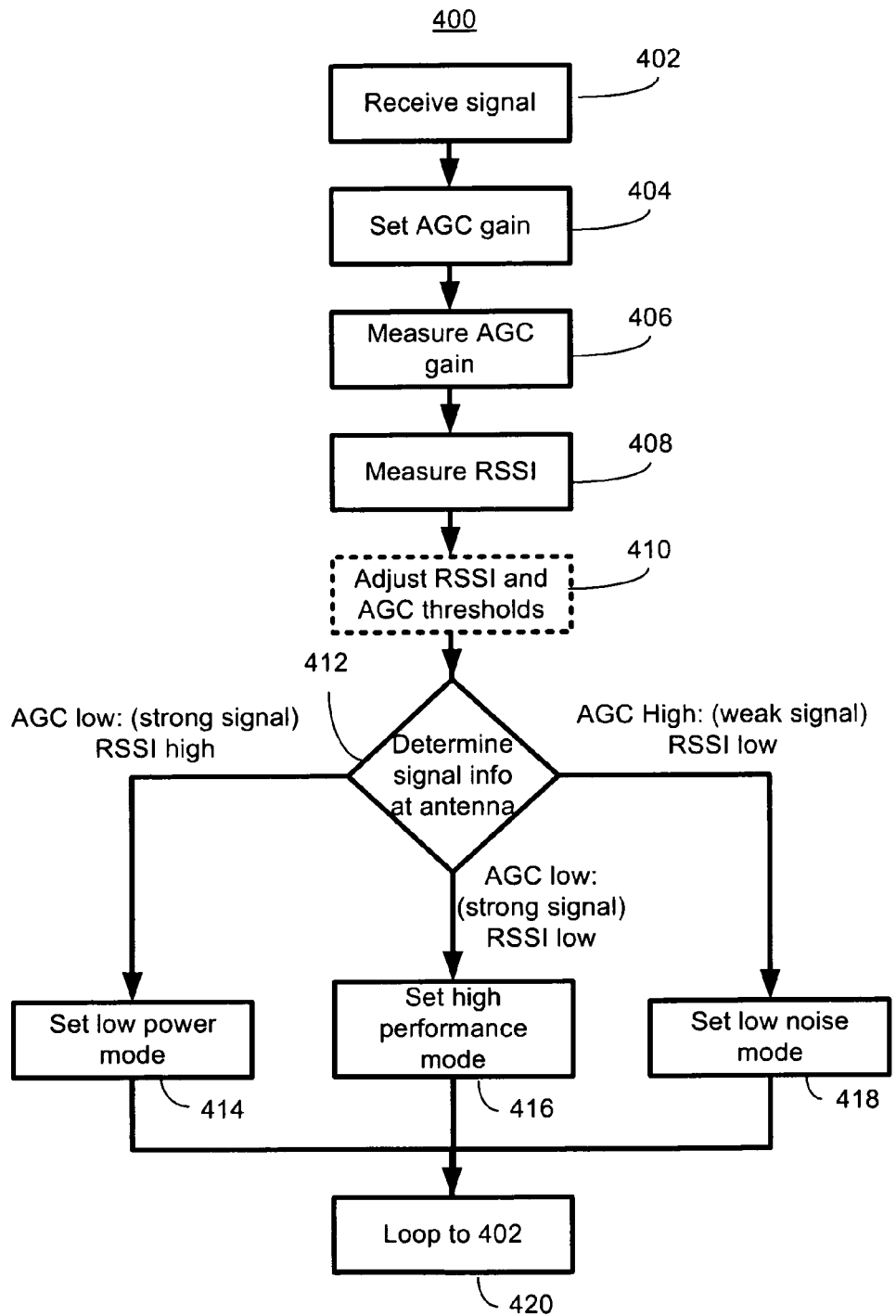
FIG. 4 is a method of performing dynamic power management in a receiver.

FIG. 4 is a method 400 of performing dynamic power management in a receiver 100. At block 402, the receiver 100 may receive a signal at an antenna 102. At block 404, an LNA level may be set, based on adjusting the signal level at the antenna 102 to a desired level. At block 406, the gain level of the LNA 106 as set by the AGC 107 may be measured and provided to a controller 126. When other controllable gain stages are present, such as variable gain amplifier 114, that corresponding AGC level may also be reported to the controller 126 by its associated AGC 116.

At block 408, a level of a signal-of-interest at an output 122 may be measured by an RSSI generator 124 and reported to the controller 126. At block 410, the controller 126 may adjust threshold levels based on absolute signal levels or outside conditions, such as battery level.

At block 412, the controller 126 may evaluate the AGC and RSSI levels, as reported by the AGCs 106, 116, and RSSI generator 124, to estimate signal information regarding the signal at the antenna 102. For example, as discussed above, such signal information may include a signal-of-interest plus noise plus interferers as implied from the one or more AGC levels and RSSI information.

If, at block 412, the AGC level is below an AGC threshold level and the RSSI is above its respective threshold level, the branch to block 414 may be taken and a low power mode set. In the low power mode, both the noise floor and IP3 (SINAD) levels may be allowed to rise by scaling back power to the receiver's filters 108 and 120. In one embodiment, a table of thresholds for each AGC present, e.g. 107, 116, and the RSSI generator 124 may be maintained. Each value may be compared to its respective threshold level in the table to determine whether it is above or below the threshold. In general, AGC values between multiple AGC components, e.g. 107, 116 should track. However, if one is above its threshold and the other below, the differences may be added and compared to a sum of the two thresholds. Other resolution schemes for AGC determination may be used, for example, all AGC values may be combined before comparison to a composite threshold. In the high performance mode, maximum filtering may be applied to the signal at the cost of higher power consumption.

If, at block 412, the controller 126 determines that the AGC is below the AGC threshold and the RSSI is below its threshold, the branch to block 416 may be taken and a high performance mode set. In one embodiment, a table of thresholds for each AGC present, e.g. 107, 116, and the RSSI generator 124 may be maintained. Each value may be compared to its respective threshold level in the table to determine whether it is above or below the threshold. In general, AGC values between multiple AGC components, e.g. 107, 116 should track. However, if one is above its threshold and the other below, the differences may be added and compared to a sum of the two thresholds. Other resolution schemes for AGC determination may be used, for example, all AGC values may be combined before comparison to a composite threshold. In the high performance mode, maximum filtering may be applied to the signal at the cost of higher power consumption.

If, at block 412, the AGC level is above the AGC threshold and the RSSI level is below its respective threshold, the branch to block 418 may be taken and a low noise mode set. In the low noise mode, filtering for noise may be maintained at a high level while filtering for distortion (IP3) may be relaxed. In one embodiment, a table of thresholds for each AGC present, e.g. 107, 116, and the RSSI generator 124 may be maintained. Each value may be compared to its respective threshold level in the table to determine whether it is above or below the threshold. In general, AGC values between multiple AGC components, e.g. 107, 116 should track. However, if one is above its threshold and the other below, the differences may be added and compared to a sum of the two thresholds. Other resolution schemes for AGC determination may be used, for example, all AGC values may be combined before comparison to a composite threshold. In the high performance mode, maximum filtering may be applied to the signal at the cost of higher power consumption.

Processing from blocks 414, 416, or 418 may continue at block 420, where processing loops back to block 402. Because of the dynamic nature of signal processing, particularly in a mobile environment, processing may occur continuously. In a stable environment, the loop 420 may occur after a pre-determined delay.

FIGS. 5A-5F, illustrate various devices in which bit synchronization for multiple antenna receivers, such as described above, may be employed.

Figure 5A:
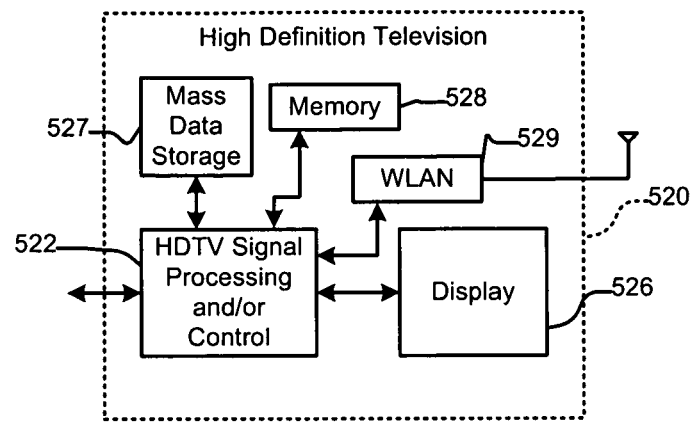
FIGS. 5A-5F illustrate embodiments of circuits that may incorporate a receiver with dynamic power management.

Referring now to FIG. 5A, such techniques may be utilized in a high definition television (HDTV) 520. HDTV 520 includes a mass data storage 527, an HDTV signal processing and control block 522, a WLAN interface and memory 528. HDTV 520 receives HDTV input signals in either a wired or wireless format and generates HDTV output signals for a display 526. In some implementations, signal processing circuit and/or control circuit 522 and/or other circuits (not shown) of HDTV 520 may process data, perform coding and/or encryption, perform calculations, format data and/or perform any other type of HDTV processing that may be required.

HDTV 520 may communicate with a mass data storage 527 that stores data in a nonvolatile manner such as optical and/or magnetic storage devices. The mass storage device may be a mini HDD that includes one or more platters having a diameter that is smaller than approximately 1.8". HDTV 520 may be connected to memory 528 such as RAM, ROM, low latency nonvolatile memory such as flash memory and/or other suitable electronic data storage. HDTV 520 also may support connections with a WLAN via a WLAN network interface 529. Both the HDTV signal processor 522 and the WLAN network interface 529 may use dynamic power management.

Figure 5B:
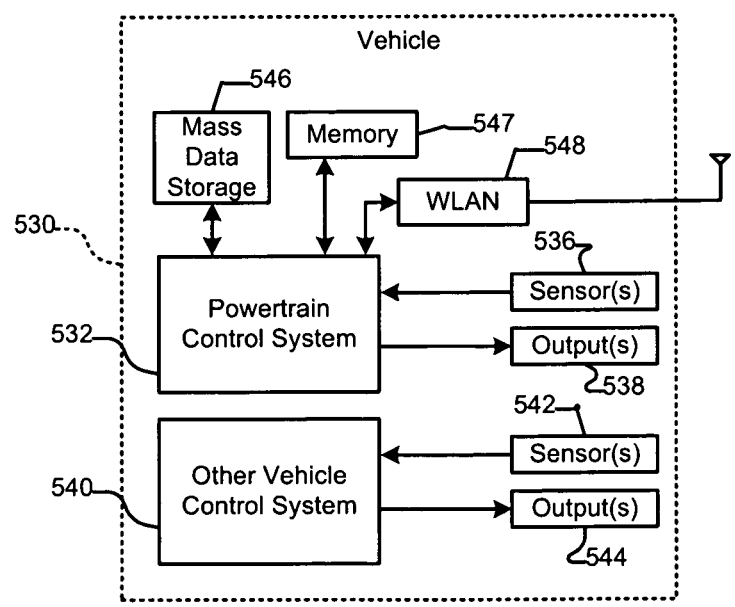

Referring now to FIG. 5B, such techniques may be utilized in a vehicle 530. The vehicle 530 includes a control system that may include mass data storage 546, as well as a WLAN interface 548. The mass data storage 546 may support a powertrain control system 532 that receives inputs from one or more sensors 536 such as temperature sensors, pressure sensors, rotational sensors, airflow sensors and/or any other suitable sensors and/or that generates one or more output control signals 538 such as engine operating parameters, transmission operating parameters, and/or other control signals.

Control system 540 may likewise receive signals from input sensors 542 and/or output control signals to one or more output devices 544. In some implementations, control system 540 may be part of an anti-lock braking system (ABS), a navigation system, a telematics system, a vehicle telematics system, a lane departure system, an adaptive cruise control system, a vehicle entertainment system such as a stereo, DVD, compact disc and the like.

Powertrain control system 532 may communicate with mass data storage 527 that stores data in a nonvolatile manner such as optical and/or magnetic storage devices. The mass storage device 546 may be a mini HDD that includes one or more platters having a diameter that is smaller than approximately 1.8". Powertrain control system 532 may be connected to memory 547 such as RAM, ROM, low latency nonvolatile memory such as flash memory and/or other suitable electronic data storage. Powertrain control system 532 also may support connections with a WLAN via a WLAN network interface 548. The control system 540 may also include mass data storage, memory and/or a WLAN interface (all not shown). In one exemplary embodiment, the WLAN network interface 548 may implement dynamic power management.

Figure 5C:
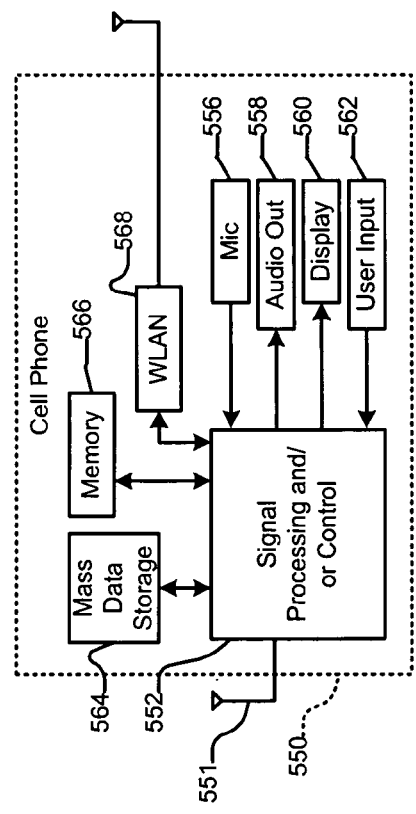

Referring now to FIG. 5C, such techniques may be used in a cellular phone 550 that may include a cellular antenna 551. The cellular phone 550 may include either or both signal processing and/or control circuits, which are generally identified in FIG. 5C at 552, a WLAN network interface 568 and/or mass data storage 564 of the cellular phone 550. In some implementations, cellular phone 550 includes a microphone 556, an audio output 558 such as a speaker and/or audio output jack, a display 560 and/or an input device 562 such as a keypad, pointing device, voice actuation and/or other input device. Signal processing and/or control circuits 552 and/or other circuits (not shown) in cellular phone 550 may process data, perform coding and/or encryption, perform calculations, format data and/or perform other cellular phone functions.

Cellular phone 550 may communicate with mass data storage 564 that stores data in a nonvolatile manner such as optical and/or magnetic storage devices for example hard disk drives HDD and/or DVDs. The HDD may be a mini HDD that includes one or more platters having a diameter that is smaller than approximately 1.8". Cellular phone 550 may be connected to memory 566 such as RAM, ROM, low latency nonvolatile memory such as flash memory and/or other suitable electronic data storage. Cellular phone 550 also may support connections with a WLAN via a WLAN network interface 568 may implement dynamic power management.

Figure 5D:
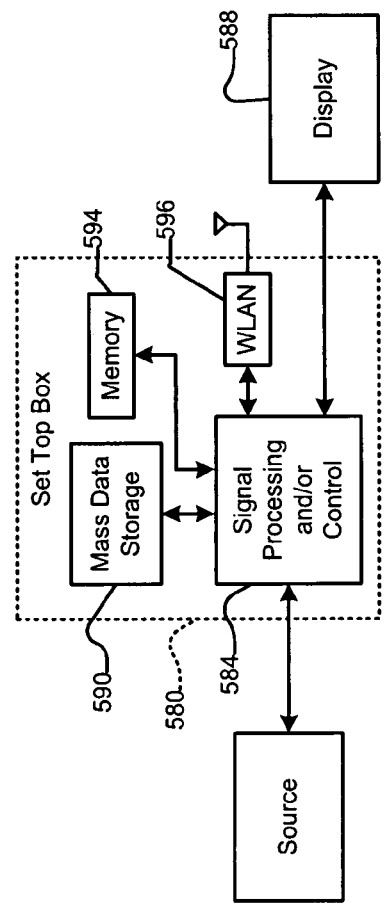

Referring now to FIG. 5D, such techniques may be utilized in a set top box 580. The set top box 580 may include either or both signal processing and/or control circuits, which are generally identified in FIG. 5D at 584, a WLAN interface and/or mass data storage 590 of the set top box 580. Set top box 580 receives signals from a source such as a broadband source and outputs standard and/or high definition audio/video signals suitable for a display 588 such as a television and/or monitor and/or other video and/or audio output devices. Signal processing and/or control circuits 584 and/or other circuits (not shown) of the set top box 580 may process data, perform coding and/or encryption, perform calculations, format data and/or perform any other set top box function.

Set top box 580 may communicate with mass data storage 590 that stores data in a nonvolatile manner and may use jitter measurement. Mass data storage 590 may include optical and/or magnetic storage devices for example hard disk drives HDD and/or DVDs. The HDD may be a mini HDD that includes one or more platters having a diameter that is smaller than approximately 1.8". Set top box 580 may be connected to memory 594 such as RAM, ROM, low latency nonvolatile memory such as flash memory and/or other suitable electronic data storage. Set top box 580 also may support connections with a WLAN via a WLAN network interface 596. The WLAN network interface may implement dynamic power management.

Figure 5E:
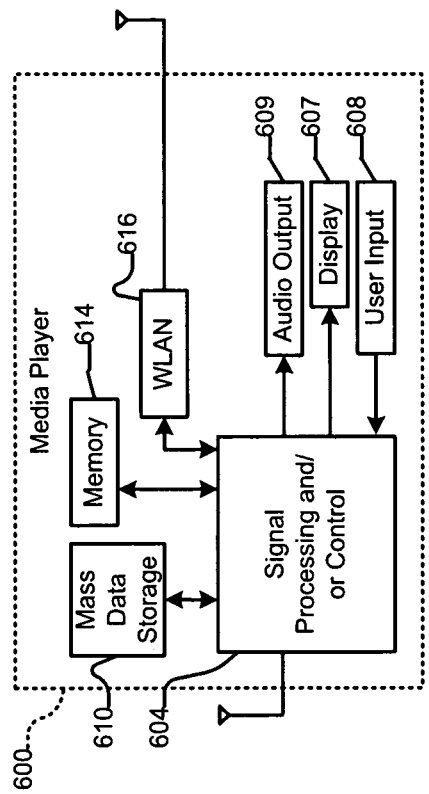

Referring now to FIG. 5E, such techniques may be used in a media player 600. The media player 600 may include either or both signal processing and/or control circuits, which are generally identified in FIG. 5E at 604, a WLAN interface and/or mass data storage 610 of the media player 600. In some implementations, media player 600 includes a display 607 and/or a user input 608 such as a keypad, touchpad and the like. In some implementations, media player 600 may employ a graphical user interface (GUI) that typically employs menus, drop down menus, icons and/or a point-and-click interface via display 607 and/or user input 608. Media player 600 further includes an audio output 609 such as a speaker and/or audio output jack. Signal processing and/or control circuits 604 and/or other circuits (not shown) of media player 600 may process data, perform coding and/or encryption, perform calculations, format data and/or perform any other media player function.

Media player 600 may communicate with mass data storage 610 that stores data such as compressed audio and/or video content in a nonvolatile manner and may utilize jitter measurement. In some implementations, the compressed audio files include files that are compliant with MP3 format or other suitable compressed audio and/or video formats. The mass data storage may include optical and/or magnetic storage devices for example hard disk drives HDD and/or DVDs. The HDD may be a mini HDD that includes one or more platters having a diameter that is smaller than approximately 1.8". Media player 600 may be connected to memory 614 such as RAM, ROM, low latency nonvolatile memory such as flash memory and/or other suitable electronic data storage. Media player 600 also may support connections with a WLAN via a WLAN network interface 616. The WLAN network interface 616 may implement dynamic power management.

Figure 5F:
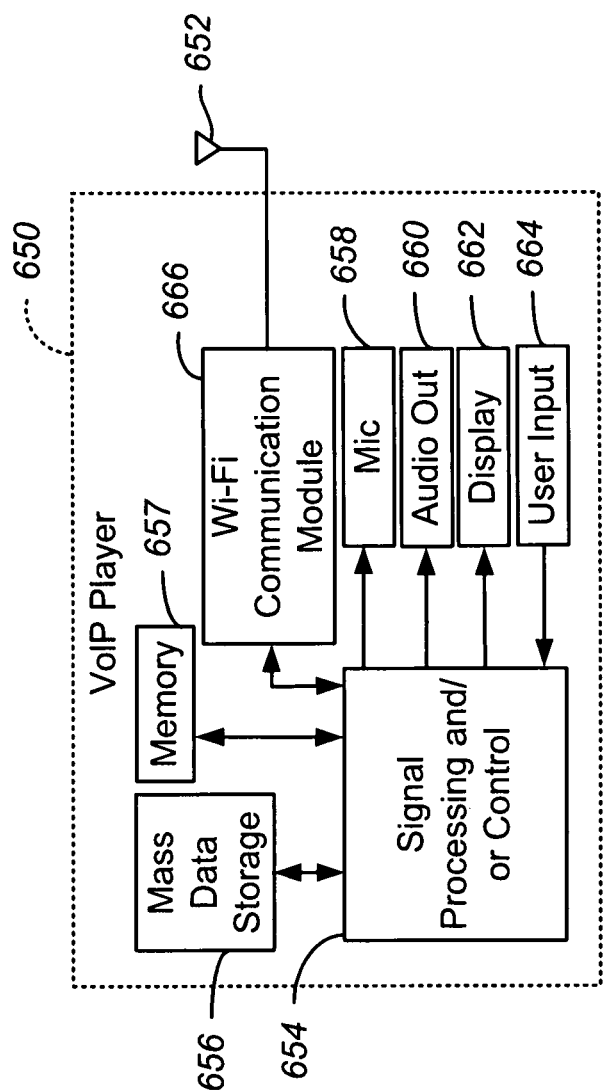

Referring to FIG. 5F, such techniques may be utilized in a Voice over Internet Protocol (VoIP) phone 650 that may include an antenna 652. The VoIP phone 650 may include either or both signal processing and/or control circuits, which are generally identified in FIG. 5F at 654, a wireless interface and/or mass data storage of the VoIP phone 650. In some implementations, VoIP phone 650 includes, in part, a microphone 658, an audio output 660 such as a speaker and/or audio output jack, a display monitor 662, an input device 664 such as a keypad, pointing device, voice actuation and/or other input devices, and a Wireless Fidelity (WiFi) communication module 666. Signal processing and/or control circuits 654 and/or other circuits (not shown) in VoIP phone 650 may process data, perform coding and/or encryption, perform calculations, format data and/or perform other VoIP phone functions.

VoIP phone 650 may communicate with mass data storage 656 that stores data in a nonvolatile manner such as optical and/or magnetic storage devices, for example hard disk drives HDD and/or DVDs. The HDD may be a mini HDD that includes one or more platters having a diameter that is smaller than approximately 1.8". VoIP phone 650 may be connected to memory 657, which may be a RAM, ROM, low latency nonvolatile memory such as flash memory and/or other suitable electronic data storage. VoIP phone 650 is configured to establish communications link with a VoIP network (not shown) via WiFi communication module 666. The WiFi communication module 666 may implement dynamic power management when communicating data via the WiFi communication module 666 or via the audio output 660 in communication with an accessory, such as a Bluetooth headset (not depicted).

The various blocks, operations, and techniques described above may be implemented in hardware, firmware, software, or any combination of hardware, firmware, and/or software. When implemented in software, the software may be stored in any computer readable memory such as on a magnetic disk, an optical disk, or other storage medium, in a RAM or ROM or flash memory of a computer, processor, hard disk drive, optical disk drive, tape drive, etc. Likewise, the software may be delivered to a user or a system via any known or desired delivery method including, for example, on a computer readable disk or other transportable computer storage mechanism or via communication media. Communication media typically embodies computer readable instructions, data structures, program modules or other data in a modulated data signal such as a carrier wave or other transport mechanism. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency, infrared and other wireless media. Thus, the software may be delivered to a user or a system via a communication channel such as a telephone line, a DSL line, a cable television line, a wireless communication channel, the Internet, etc. (which are viewed as being the same as or interchangeable with providing such software via a transportable storage medium) When implemented in hardware, the hardware may comprise one or more of discrete components, an integrated circuit, an application-specific integrated circuit (ASIC), etc.

While the present invention has been described with reference to specific examples, which are intended to be illustrative only and not to be limiting of the invention, it will be apparent to those of ordinary skill in the art that changes, additions or deletions in addition to those explicitly described above may be made to the disclosed embodiments without departing from the spirit and scope of the invention.

We claim:

1. A receiver, comprising:
    a low noise amplifier;
    an automatic gain control (AGC) coupled to the low noise amplifier, wherein the AGC is configured to adjust a gain of the low noise amplifier;
    a first adaptive filter coupled to an output of the low noise amplifier;
    a mixer coupled to an output of the first adaptive filter;
    a second adaptive filter coupled to an output of the mixer;
    a received signal strength indicator (RSSI) generator coupled to the second adaptive filter; and
    a controller configured to
    receive (i) a first signal from the AGC and (ii) a second signal from the RSSI generator, and
    based on the first signal and the second signal, adjust the first adaptive filter and the second adaptive filter.

2. The receiver of claim 1, wherein the controller is configured to adjust a bias current of the first adaptive filter and the second adaptive filter.

3. The receiver of claim 2, wherein the controller increases the bias current to the first adaptive filter over a nominal bias level when an AGC level is set below a first threshold level and an RSSI level is below a second threshold level.

4. The receiver of claim 2, wherein the controller decreases the bias current to the first adaptive filter over a nominal bias level when an AGC level is below a first threshold level and an RSSI level is above a second threshold level.

5. The receiver of claim 2, wherein the controller increases the bias current to the first adaptive filter and decreases the bias current to the second adaptive filter compared to a nominal bias level when the AGC is above a first threshold level and an RSSI level is below a second threshold level.

6. The receiver of claim 1, wherein the second adaptive filter is one of a digital filter and an analog filter.

7. The receiver of claim 4, wherein the controller implements hysteresis when evaluating whether the AGC level is below the first threshold level and whether the RSSI level is below the second threshold level.

8. The receiver of claim 1, further comprising a third adaptive filter, wherein the controller is configured to adjust a filter characteristic of the third adaptive filter, and wherein the filter characteristic is used to adjust intermodulation (IM) sensitivity in the third adaptive filter.

9. The receiver of claim 8, further comprising an analog to digital converter (ADC), the ADC having (i) an ADC input coupled to the second adaptive filter, and (ii) an ADC output coupled to the third adaptive filter.

10. The receiver of claim 9, wherein the third adaptive filter is a digital adaptive filter coupled to the ADC output.

11. The receiver of claim 1, wherein the first adaptive filter is a radio frequency (RF) adaptive filter.

12. The receiver of claim 1, wherein the second adaptive filter is an intermediate frequency adaptive filter.

13. The receiver of claim 1, wherein the controller approximates signal-to-noise ratio (SNR) according (i) to a state of the AGC and (ii) an RSSI level.

14. The receiver of claim 1, further comprising an antenna.

* * * * *